United States Patent
Drobny (10) Patent No.: US 10,535,783 B2
(45) Date of Patent: Jan. 14, 2020

(54) UNGUARDED SCHOTTKY BARRIER DIODES

(71) Applicant: TEXAS INSTRUMENTS INCORPORATED, Dallas, TX (US)

(72) Inventor: Vladimir Frank Drobny, Tucson, AZ (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/615,090

(22) Filed: Jun. 6, 2017

(65) Prior Publication Data

US 2017/0278984 A1 Sep. 28, 2017

Related U.S. Application Data (60) Division of application No. 15/155,915, filed on May 16, 2016, now Pat. No. 9,705,011, which is a continuation of application No. 13/857,923, filed on Apr. 5, 2013, now Pat. No. 9,391,160, which is a division of application No. 11/757,767, filed on Jun. 4, 2007, now Pat. No. 8,435,873.

(60) Provisional application No. 60/804,192, filed on Jun. 8, 2006, provisional application No. 60/804,195, filed on Jun. 8, 2006.

(51) Int. Cl.
 *H01L 29/87* (2006.01)
 *H01L 29/872* (2006.01)
 *H01L 29/66* (2006.01)

(52) U.S. Cl.
 CPC .... *H01L 29/8725* (2013.01); *H01L 29/66143* (2013.01); *H01L 29/872* (2013.01)

(58) Field of Classification Search
 CPC ....................................... H01L 21/00
 See application file for complete search history.

(56) References Cited

U.S. PATENT DOCUMENTS

| | | | |
|---|---|---|---|
| 3,675,313 A | 7/1972 | Driver et al. | |
| 3,742,315 A | 6/1973 | Iizuka et al. | |
| 3,764,865 A | 10/1973 | Napoli et al. | |
| 3,816,194 A | 6/1974 | Kroger et al. | |
| 3,906,540 A * | 9/1975 | Hollins | H01L 21/00 257/476 |
| 3,906,620 A | 9/1975 | Anzai et al. | |
| 4,179,533 A | 12/1979 | Christou et al. | |

(Continued)

OTHER PUBLICATIONS

J. David Burnett, et al. "Modeling Hot-Carrier Effects in Polysilicon Emitter Bipolar Transistors," IEEE Transactions on Electron Devices, vol. 35, No. 12, Dec. 1988, pp. 2238-2244.

(Continued)

*Primary Examiner* — Eliseo Ramos Feliciano
*Assistant Examiner* — Ankush K Singal
(74) *Attorney, Agent, or Firm* — Andrew R. Ralston; Charles A. Brill; Frank D. Cimino (57) ABSTRACT

One embodiment of the disclosure relates to an unguarded Schottky barrier diode. The diode includes a cathode that has a recessed region and a dielectric interface surface that laterally extends around a perimeter of the recessed region. The diode further includes an anode that conforms to the recessed region. A dielectric layer extends over the dielectric interface surface of the cathode and further extends over a portion of the anode near the perimeter. Other devices and methods are also disclosed.

20 Claims, 7 Drawing Sheets

(56) References Cited

U.S. PATENT DOCUMENTS

| | | |
|---|---|---|
| 4,186,410 A | 1/1980 | Cho et al. |
| 4,240,196 A | 12/1980 | Jacobs et al. |
| 4,358,891 A * | 11/1982 | Roesner ............. H01L 21/2257 148/DIG. 147 |
| 4,380,489 A | 4/1983 | Beinvogl et al. |
| 4,397,079 A | 8/1983 | Nagaraian et al. |
| 4,414,737 A | 11/1983 | Menjo et al. |
| 4,419,811 A | 12/1983 | Rice |
| 4,459,605 A | 7/1984 | Rice |
| 4,497,107 A | 2/1985 | Cogan |
| 4,516,143 A | 5/1985 | Love |
| 4,619,887 A | 10/1986 | Hooper et al. |
| 4,622,736 A | 11/1986 | Drobny |
| 4,667,395 A | 5/1987 | Ahlgren et al. |
| 4,691,435 A | 9/1987 | Anantha et al. |
| 4,748,103 A | 5/1988 | Hollinger |
| 4,839,715 A | 6/1989 | Gajda et al. |
| 4,851,369 A | 7/1989 | Ellwanger et al. |
| 4,862,244 A | 8/1989 | Yamagishi |
| 4,864,378 A | 9/1989 | Tsaur |
| 4,895,810 A | 1/1990 | Meyer et al. |
| 4,952,527 A | 8/1990 | Calawa et al. |
| 5,019,522 A | 5/1991 | Meyer et al. |
| 5,137,840 A | 8/1992 | Desilets et al. |
| 5,147,809 A | 9/1992 | Won et al. |
| 5,245,207 A | 9/1993 | Mikoshiba |
| 5,254,867 A | 10/1993 | Fukuda |
| 5,258,640 A | 11/1993 | Hsieh et al. |
| 5,323,032 A | 6/1994 | Sato |
| 5,326,718 A | 7/1994 | Klose et al. |
| 5,332,627 A | 7/1994 | Watanabe et al. |
| 5,354,716 A | 10/1994 | Pors et al. |
| 5,438,218 A | 8/1995 | Nakamura et al. |
| 5,504,018 A | 4/1996 | Sato |
| 5,550,069 A | 8/1996 | Roth |
| 5,644,190 A | 7/1997 | Potter |
| 5,698,890 A | 12/1997 | Sato |
| 5,825,079 A | 10/1998 | Metzler et al. |
| 5,895,248 A | 4/1999 | De Boer et al. |
| 5,960,312 A | 9/1999 | Morikawa |
| 5,994,753 A | 11/1999 | Nitta |
| 6,027,991 A | 2/2000 | Sasaki |
| 6,096,629 A | 8/2000 | Tsai et al. |
| 6,262,439 B1 * | 7/2001 | Takeuchi ............. H01L 21/0485 257/77 |
| 6,294,445 B1 | 9/2001 | Bol et al. |
| 6,323,525 B1 | 11/2001 | Noguchi et al. |
| 6,337,251 B1 * | 1/2002 | Hashimoto ........ H01L 29/66242 257/E21.371 |
| 6,355,981 B1 | 3/2002 | Richards et al. |
| 6,380,095 B1 | 4/2002 | Liu et al. |
| 6,455,403 B1 | 9/2002 | Hwang et al. |
| 6,593,217 B1 * | 7/2003 | Fujisawa ........... H01L 21/28518 257/E21.165 |
| 6,790,753 B2 | 9/2004 | Desko et al. |
| 6,812,527 B2 | 11/2004 | Dennard et al. |
| 6,864,535 B2 | 3/2005 | Tihanyi |
| 6,872,964 B2 | 3/2005 | Naberhuis et al. |
| 6,998,694 B2 | 2/2006 | Wu |
| 7,002,187 B1 | 2/2006 | Husher |
| 7,002,190 B1 | 2/2006 | Geiss et al. |
| 7,071,503 B2 | 7/2006 | Dohnke et al. |
| 7,075,155 B1 * | 7/2006 | Pelella ................ H01L 27/0259 257/355 |
| 7,112,918 B2 | 9/2006 | Eden et al. |
| 7,151,035 B2 | 12/2006 | Koshimizu et al. |
| 7,473,929 B2 | 1/2009 | Kusumoto et al. |
| 7,566,999 B2 | 7/2009 | Neal |
| 7,732,842 B2 | 6/2010 | Session |
| 7,880,228 B2 | 2/2011 | Yasutake |
| 8,049,254 B2 | 11/2011 | Pacheco Rotondaro et al. |
| 8,263,467 B2 | 9/2012 | Gruup et al. |
| 2002/0158281 A1 | 10/2002 | Goldbach |
| 2003/0087482 A1 | 5/2003 | Hwang et al. |
| 2003/0119264 A1 * | 6/2003 | Park ..................... H01L 29/665 438/268 |
| 2003/0119314 A1 * | 6/2003 | Ogura .................. H01L 21/743 438/683 |
| 2003/0137010 A1 | 7/2003 | Fredrichs et al. |
| 2004/0038517 A1 * | 2/2004 | Kang ................. H01L 21/28518 438/630 |
| 2004/0089908 A1 | 5/2004 | Desko et al. |
| 2004/0224464 A1 | 11/2004 | Gonzalez et al. |
| 2005/0040489 A1 | 2/2005 | Chuang et al. |
| 2005/0173739 A1 | 8/2005 | Kusumoto et al. |
| 2006/0006477 A1 | 1/2006 | Hashimi et al. |
| 2006/0008975 A1 | 1/2006 | Gonzalez et al. |
| 2006/0022291 A1 | 2/2006 | Drobney et al. |
| 2006/0028111 A1 | 2/2006 | Park et al. |
| 2006/0076639 A1 | 4/2006 | Lypen et al. |
| 2006/0099770 A1 * | 5/2006 | Bromberger ........ H01L 29/1004 438/400 |
| 2006/0131619 A1 | 6/2006 | Wu |
| 2006/0131646 A1 * | 6/2006 | Wu .................... H01L 29/66333 257/335 |
| 2006/0138450 A1 | 6/2006 | Lanois et al. |
| 2007/0026591 A1 | 2/2007 | Grupp et al. |
| 2007/0052057 A1 | 3/2007 | Drobny |
| 2007/0075362 A1 * | 4/2007 | Wu .................... H01L 29/7813 257/335 |
| 2008/0217721 A1 | 9/2008 | Hamerski et al. |
| 2009/0104762 A1 | 4/2009 | Kusumoto et al. |

OTHER PUBLICATIONS

Vladimir Drobny, "Relationship Between Junction Radius and Reverse Leakage of Silicide Schottky-Barrier Diodes," IEEE Transactions on Electron Devices, vol. ED-31, No. 7, Jul. 1984, pp. 895-899.

* cited by examiner

UNGUARDED SCHOTTKY BARRIER DIODES

RELATED APPLICATIONS

Under 35 U.S.C. §§ 119(e), 120, and 121, this divisional application claims the benefit of priority to U.S. patent application Ser. No. 15/155,915, filed on May 16, 2016, which is a continuation application claiming the benefit of priority to U.S. Pat. No. 9,391,160, filed on Apr. 5, 2013, which is a divisional application claiming priority to U.S. Pat. No. 8,435,873, filed on Jun. 4, 2007, which claims priority to U.S. Provisional Application Ser. No. 60/804,192, filed on Jun. 8, 2006, and to U.S. Provisional Application Ser. No. 60/804,195 filed on Jun. 8, 2006. The entirety of the above reference applications are incorporated herein by reference.

FIELD

The present disclosure relates generally to semiconductor devices and more particularly to unguarded Schottky barrier diodes.

BACKGROUND

Figure 1:
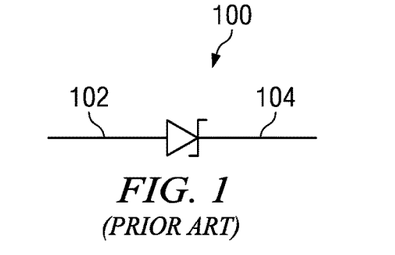
FIG. 1 shows a circuit symbol for a Schottky barrier diode.

A diode is an electrical component that allows current to flow in one direction, but not in the other. FIG. 1 is a circuit symbol of a typical Schottky barrier diode 100, where the diode 100 has an anode 102 (metal) in direct contact with a cathode 104 (n-type semiconductor). In Schottky barrier diodes, conventional current can typically flow from the anode 102 to the cathode 104, but not from the cathode to the anode. Schottky barrier diodes typically result in fast switching times and low forward voltage drop, relative to conventional p-n diodes.

Schottky barrier diodes are available in guarded and unguarded diode configurations. Guarded Schottky barrier diodes include a p-n junction guard ring disposed in the substrate around the perimeter of the diode. Although the p-n junction guard ring virtually eliminates some adverse leakage current effects around the perimeter, at higher forward bias (especially for high barrier height silicides) there is significant injection of minority carriers. This injection leads to very slow diode recovery after the forward bias is removed. This phenomenon cannot be tolerated in many high-speed applications.

Therefore, many high speed applications require integrated unguarded Schottky barrier diodes to be able to operate at high reverse bias voltages while offering very fast recovery speeds. For some time, however, these diodes have suffered from hot carrier damage even after a modest reverse bias of 10-15 volts or less. This hot carrier damage can lead to unguarded Schottky barrier diodes with non-ideal I-V characteristics. Accordingly, there remains a need for improved unguarded Schottky barrier diodes and manufacturing techniques.

SUMMARY

The following presents a simplified summary in order to provide a basic understanding of one or more aspects of the disclosure. This summary presents one or more concepts of the disclosure in a simplified form as a prelude to the more detailed description that is presented later and is not an extensive overview of the disclosure. In this regard, the summary is not intended to identify key or critical elements of the disclosure, nor does the summary delineate the scope of the disclosure.

One embodiment of the disclosure relates to an unguarded Schottky barrier diode. The diode includes a cathode comprising a recessed region and a dielectric interface surface that laterally extends around a perimeter of the recessed region. A silicide layer at least substantially conforms to the recessed region. The diode also includes a dielectric layer having a window with sidewalls that are near the perimeter of the recessed region, and the dielectric layer extends continuously over the dielectric interface surface and at least a portion of the silicide layer near the perimeter of the recessed region.

The following description and annexed drawings set forth in detail certain illustrative aspects and implementations of the disclosure. These are indicative of but a few of the various ways in which the principles of the disclosure may be employed.

DETAILED DESCRIPTION

The present disclosure will now be described with reference to the attached drawing figures, wherein like reference numerals are used to refer to like elements throughout, and wherein the illustrated structures and devices are not necessarily drawn to scale.

Aspects of this disclosure are aimed at preventing formation of a leaky metal insulator semiconductor (MIS) parasitic diode at the Schottky barrier diode perimeter. A more detailed description of this problem is now discussed with reference to FIG. 2, which shows an unguarded Schottky barrier diode 200 having a leaky, low-barrier height MIS diode 202 at its perimeter. In essence, the MIS diode 202 allows current to "leak" through or around the diode, which causes the overall diode characteristics to significantly deviate from those of an ideal diode.

Figure 2:
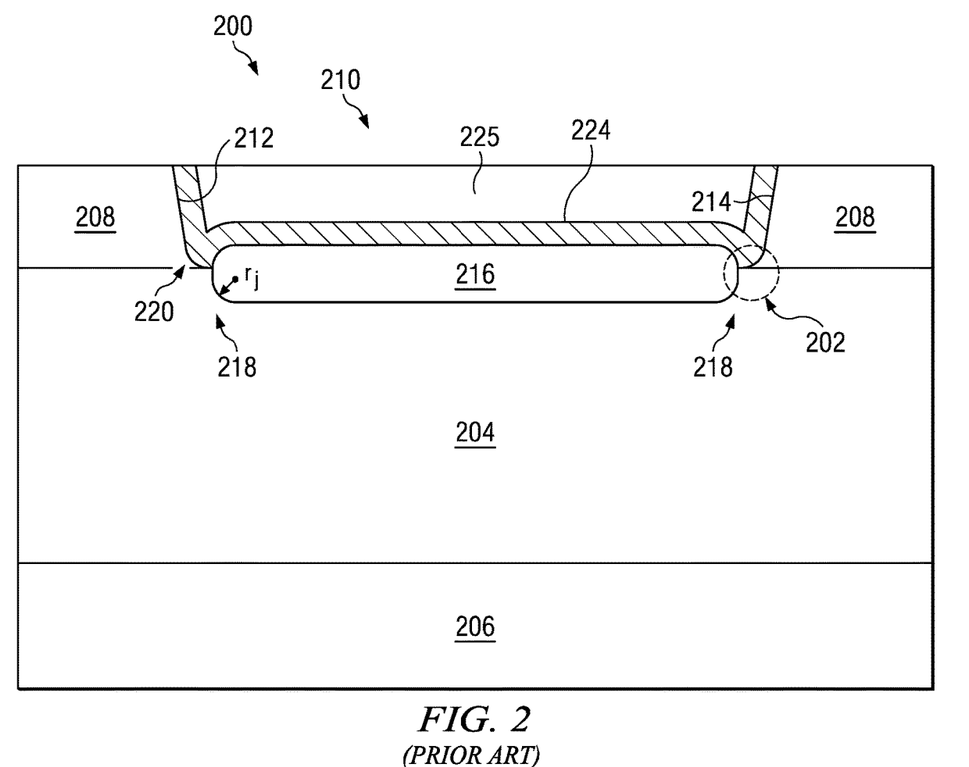
FIG. 2 shows a diode that may suffer from leakage current through a metal insulator diode.

Briefly, the diode 200 includes an n-type lightly doped Silicon cathode 204 under which a buried layer 206 (cathode contact) resides. A dielectric layer 208 is formed over the cathode 204, where a window 210 with tapered sidewalls 212, 214 is formed within the dielectric layer 208. A silicide layer 216 is in direct contact with the cathode 204 and is directly adjacent to the bottom of the tapered sidewalls 212, 214. Although not shown, a Ti-based diffusion barrier metal (or other refractory metal) is typically formed over the silicide layer 216.

The parasitic MIS diode 202 is formed at a perimeter 218 of the Schottky barrier diode (i.e., near the bottom of the tapered sidewalls 212, 214 of the dielectric). More particularly, the MIS diode 202 exists where a thin dielectric tail 220 is sandwiched between the diffusion barrier metal (not shown here) and the cathode 204. Ideally, during operation, all current would flow directly between the cathode 204 and anode 216 of the diode, and not through the MIS diode 202. However, the inventors have appreciated that a sufficiently thin dielectric tail 220 allows the MIS diode 202 to conduct a significant amount of current by tunneling. This leakage current, combined with the current flowing through the anode 216 causes the Schottky barrier diode 200 to have non-ideal I-V characteristics.

Moreover, this parasitic leakage current from the MIS diode is highly variable and difficult to control. This results in poor manufacturing repeatability and poor device to device matching. Thus, diode 200 is not generally usable in high precision circuits unless the problem with the formation of the MIS diode can be prevented. Note that the MIS diode dominates the forward bias characteristics only at lower bias voltages because its high series resistance limits its current at higher forward bias voltages (i.e., the cathode and anode 216 of the Schottky barrier diode have a low series resistance that does not limit the current flow at higher bias voltages).

Other aspects of this disclosure are aimed at suppressing hot carrier damage at the perimeter 218 of unguarded Schottky barrier diodes. Hot carrier damage can occur when charged carriers (electrons or holes) are accelerated by a high electric field present at the perimeter 218 of the diode 200. These hot carriers are injected into the dielectric 208, and damage the dielectric/silicon interface by generating charged trapping centers. Note that the electric field at the perimeter of the diode is described by the following equation:

$$E(r_j) = -\frac{qN_D}{2\varepsilon_s}\left(\frac{r_W^2 - r_j^2}{r_j}\right) \quad (1)$$

where E is the electric field, $r_W$ is the depletion layer edge and $r_j$ is the radius of the anode/cathode junction at the perimeter. Equation 1 shows that the electric field is inversely proportional to the radius $r_j$.

Another element contributing to hot carrier damage is the oxide/silicon interface at the diode's perimeter, (i.e., the location where hot carriers can inflict damage by creating positively charged trapping centers). The density of these charge centers is a linearly dependent function of the perimeter current and time. This charge enhances the carrier concentration at the perimeter of an n-type substrate and reduces the carrier concentration of a p-type substrate. Increase in the effective doping concentration further increases the electric field, as described in Equation 1, by increasing $N_D$ in this example for an n-type silicon substrate. The effective Schottky barrier height is reduced by the barrier lowering terms below, $$\Phi_B^* = \Phi_{B0} - \alpha E - \sqrt{\frac{qE}{4\pi\varepsilon_s}} \quad (2)$$

where $\Phi_{B0}$ is the intrinsic barrier height, and $\alpha$ is the tunneling coefficient ($\alpha$=3 nm for PtSi). Increase in the electric field, caused by the localized increase in the carrier concentration, results in a drop of the effective Schottky barrier height at the perimeter after the reverse bias stress damage occurs. This explains why there is an increase in the reverse current after subjecting the diode to a significant reverse bias stress. The opposite effect, i.e. decrease in reverse current is observed in diodes with a p-type silicon substrate where the localized carrier concentration decreases after the stress.

Figure 3A:
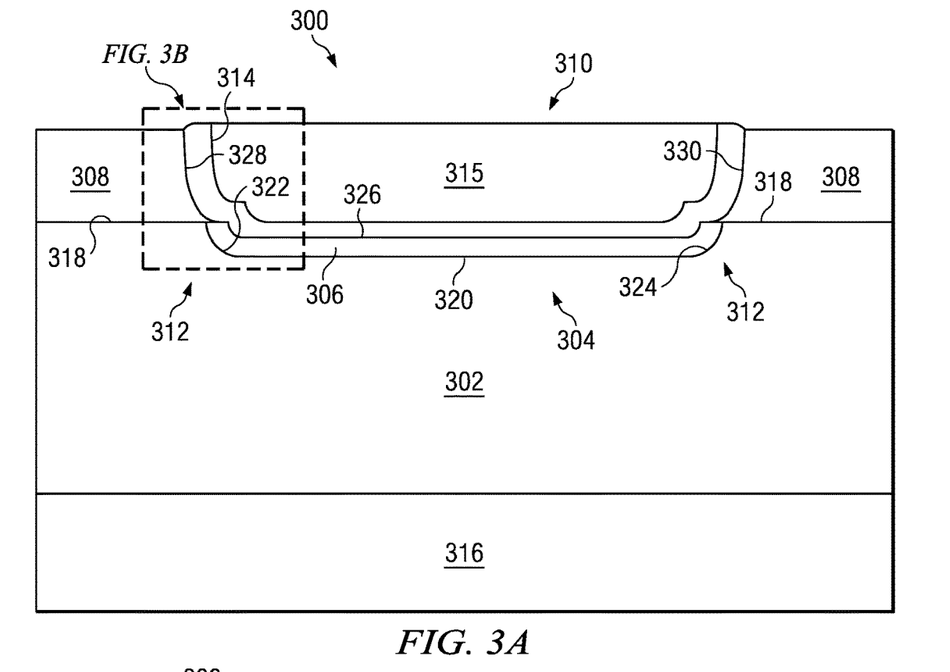
FIGS. 3A-3B show an unguarded Schottky barrier diode that may mitigate formation of a metal insulator diode at its perimeter.
Figure 3B:
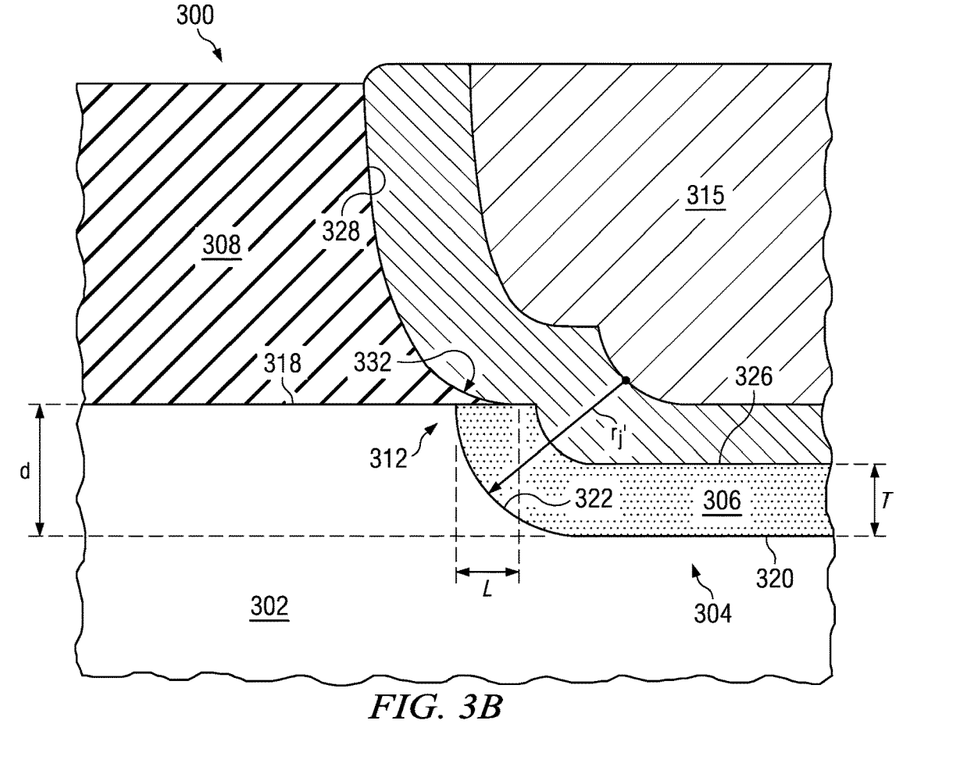

Therefore, aspects of the present disclosure aim to prevent the formation of the MIS diode and to suppress hot carrier damage at the perimeter of the Schottky barrier diode. FIGS. 3A-3B show one unguarded Schottky barrier diode 300 that may achieve these ends. The diode 300 includes a cathode 302 having a recessed region 304 over which a silicide layer 306 is formed. A dielectric layer 308 having a window 310 therein overlies the cathode 302. To prevent the formation of an MIS diode, the silicide layer 306 undercuts a portion of the dielectric layer 308 near a perimeter 312 of the recessed region 304. A diffusion barrier metal 314 (e.g., a Ti-based diffusion barrier metal or other similar refractory metal) could be formed over the silicide layer. In effect, by providing a silicide layer 306 that undercuts the dielectric layer 308, the diode 300 provides significantly thick isolation between the barrier diffusion metal 314 and the cathode 302, such that current tunneling and thus unwanted parasitic leakage will not occur.

In addition, because the silicide layer 306 undercuts the dielectric 308, the diode 300 has an increased anode/cathode junction radius $r_j'$ (relative to radius $r_j$ of diode 220), which reduces the electric field carriers experience, thereby limiting hot carrier damage.

As shown, the cathode 302 typically overlies a highly conductive buried layer 316, which could be an n-type highly doped Si substrate, that serves as a cathode contact.

The cathode 302, which could be an n-type lightly doped Silicon substrate, includes a dielectric interface surface 318 that laterally extends around the perimeter 312 of the recessed region 304. The recessed region 304 may have a recessed surface 320 and concave sidewalls 322, 324.

The silicide layer 306 may substantially conform to the recessed region 304. Depending on the implementation, the silicide layer 306 may have various thicknesses. For example, in the illustrated embodiment, the silicide thickness, T, is such that a top silicide surface 326 is positioned between the dielectric interface surface 318 and the recessed surface 320. However, depending on the silicide layer thickness, T, and the depth, d, of the recessed region, the top silicide surface 326 could also be above the dielectric interface surface 318.

The dielectric layer 308 can be characterized by window 310 or aperture in the dielectric layer, which has sidewalls 328, 330 that are near the perimeter 312 of the recessed region. In the illustrated embodiment, the sidewalls are generally concave, although they could be convex or substantially vertical in other embodiments. These sidewalls may cause the dielectric layer to include a tail 332, which is a thin region of the dielectric sandwiched between the barrier diffusion metal 314 and the silicide layer 306. The extent by which the recessed region must undercut the tail 332 (length L) may be a function of the reverse bias the diode is to withstand. As the reverse bias the diode is to withstand increases, a designer may increase the length L, depth d, and/or the thickness T of the silicide layer. In effect, by increasing the length L, depth d, and/or thickness T, the designer is providing greater isolation between the barrier diffusion metal 314 and the cathode 302, such that unwanted parasitic leakage will not occur. The same is also increasing the radius $r_j$ and decreasing the electric field as described by Equation 1. For example, in one embodiment where the diode is to withstand a reverse bias of approximately 20 V, the recessed region undercuts the dielectric by a length L of approximately 10-100 nm. In various embodiments, the Silicide layer may have a thickness, T, of approximately 10-100 nm.

Figure 4:
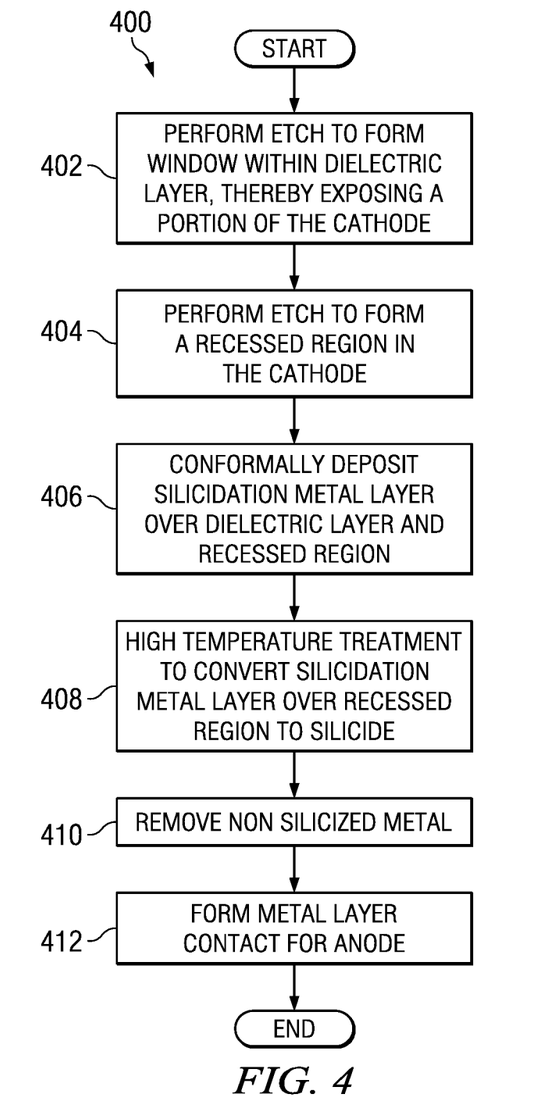
FIG. 4 shows a somewhat general method of forming an unguarded Schottky barrier diode.

While the potential advantages of the above described Schottky barrier diodes are apparent, successful fabrication of such Schottky barrier diodes are needed. In order to aid in the successful fabrication of these Schottky barrier diodes, aspects of the present disclosure relate to methods of manufacturing Schottky barrier diodes. For illustrative purposes, a general method 400 is illustrated in FIG. 4, while a more detailed method 500 is described in FIGS. 5-12. While these methods are illustrated and described below as a series of acts or events, it will be appreciated that the present disclosure is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects or embodiments of the present disclosure. Further, one or more of the acts depicted herein may be carried out in one or more separate acts and/or phases.

Referring now to FIG. 4, method 400 starts with a dielectric layer overlying a cathode in a semiconductor substrate. At 402, a window is etched into the dielectric layer, thereby exposing a portion of the cathode. In 404, an etch is performed to form a recessed region in the cathode. In various embodiments, blocks 402 and 404 may be performed in a single etch that results in a significant isotropic overetch at the perimeter of the diode. This overetch creates a silicon profile with a junction radius much larger than created by prior art processes. Thus, this etch leads to an unguarded Schottky barrier diode with significantly reduced electric field (relative to prior art processes), which can suppress the onset of the reverse bias induced hot carrier damage until much higher bias voltages are applied. After the recessed region is formed, in 406 a metal that is used in silicide formation is conformally deposited over the recessed region. In 408, the metal layer in the recessed region is converted to a metal silicide using a high temperature treatment. In 410, the non-silicide metal is removed. Lastly, in 412, a metal layer contact for the anode is formed.

Now that the somewhat general method 400 has been discussed, a more detailed method 500 is illustrated with reference to FIGS. 5-12, which show cross sectional views of various stages in the manufacture of one embodiment of an unguarded Schottky barrier diode.

Figure 5:
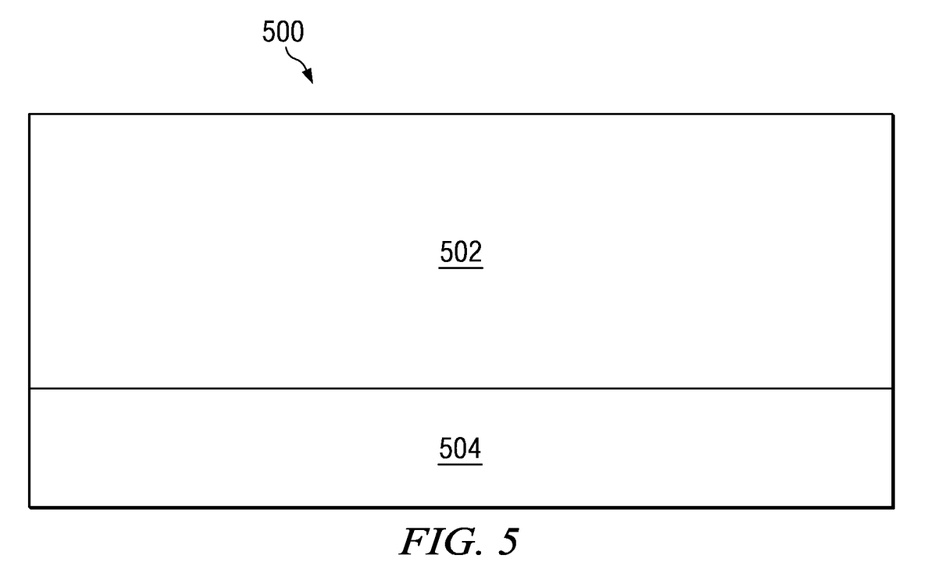
FIGS. 5-12 show cross-sectional views of stages in a more detailed method of forming an unguarded Schottky barrier diode.

Referring to FIG. 5, one can see the method 500 starts when a lightly doped Si cathode 502 is formed over a highly doped buried layer 504. The highly conductive buried layer 504 could be formed, for example, by implanting a high-dopant concentration of n-type impurities into the substrate, which is than followed by epitaxial growth of lightly doped silicon layer 502 forming the cathode region.

Figure 6:
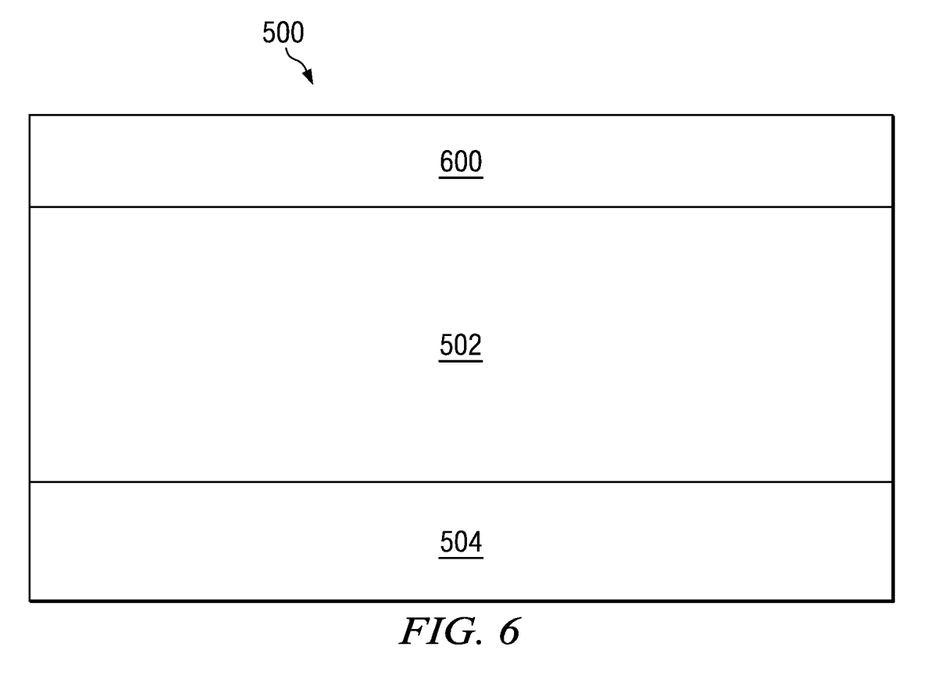

In FIG. 6, a dielectric layer 600 has been formed over the lightly doped Silicon cathode 502. In various embodiments, the dielectric layer 600 could comprise a single layer or some combination of both, the thermally grown $SiO_2$ and/or deposited $SiO_2$ or silicon nitride or another suitable dielectric. In some embodiments the dielectric layer may include spacers, although in various embodiments the dielectric layer may not include spacers and/or may comprise a single solid material (e.g., field oxide or other continuous material).

Figure 7:
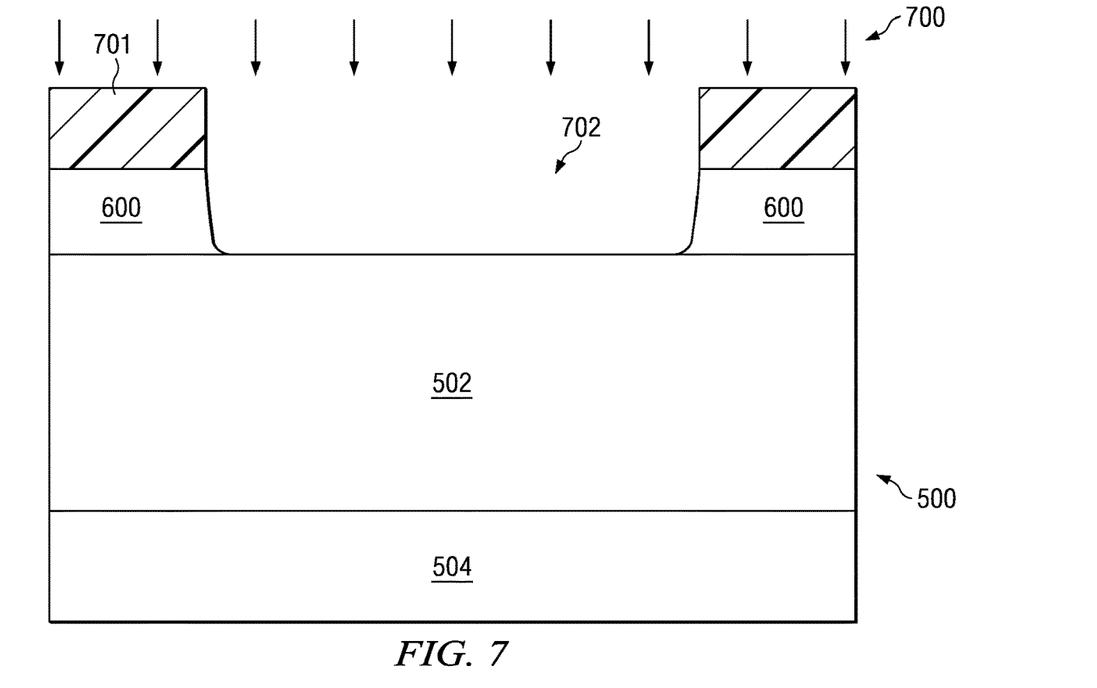
Figure 8:
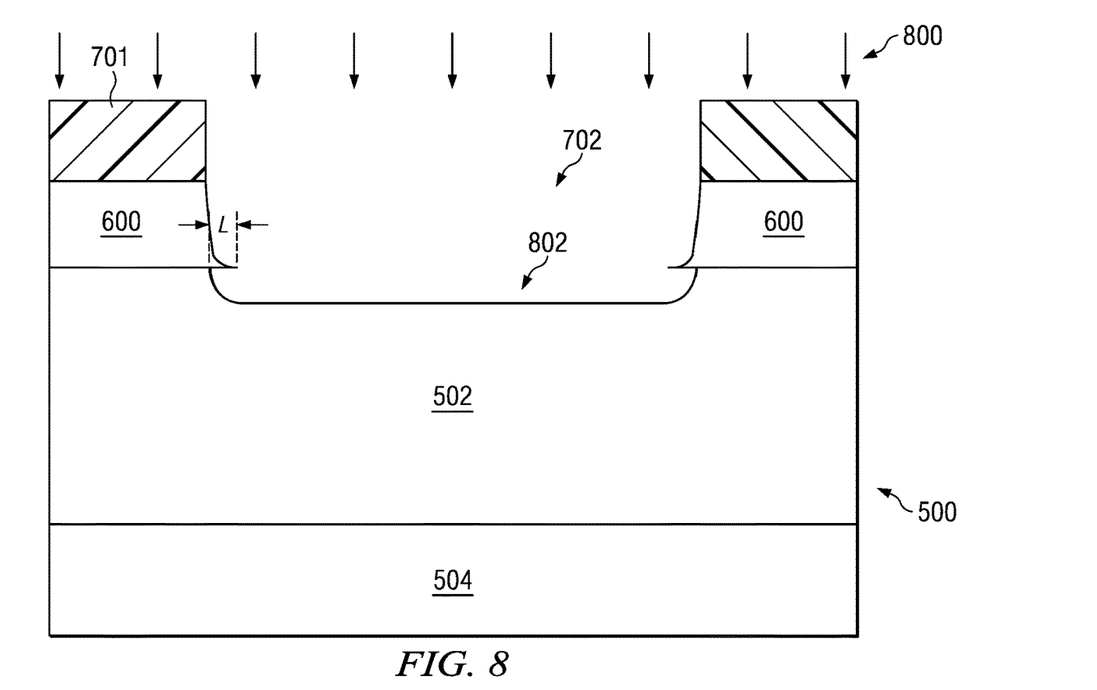

After the dielectric layer 600 has been formed, method 500 proceeds to FIGS. 7-8 where a mask (not shown), such as photoresist or a hard mask, has been formed over the dielectric layer. In FIG. 7, an etch 700 is performed to form a window 702 in the dielectric layer 600 through which a portion of the cathode is exposed. In some embodiments, this etch 700 could be an isotropic (multi-directional) etch, such as a wet or plasma etch, and would result in concave sidewalls. In other embodiments, this etch 700 could be an anisotropic etch (uni-directional) etch, such as a plasma (RIE) etch, and would result in relatively vertical sidewalls. In FIG. 8, an etch 800 is performed to form a recessed region 802 within the cathode 502. This etch 800 is typically an isotropic etch that is selective between the Si cathode and the dielectric layer, thereby removing a portion of the cathode and undercutting the dielectric layer by length L.

In some embodiments, etches 700 and 800 could be carried out as separate etches. In other embodiments, etches 700 and 800 may be performed as a single etch, where the semiconductor structure is kept within the etch tool and not exposed to the laboratory environment. Many different single etches, having different material selectivities and etch rates, or sequential etches may accomplish similar end results. The selection of a particular etch technique depends upon fabrication capability, cost or just convenience.

Figure 9:
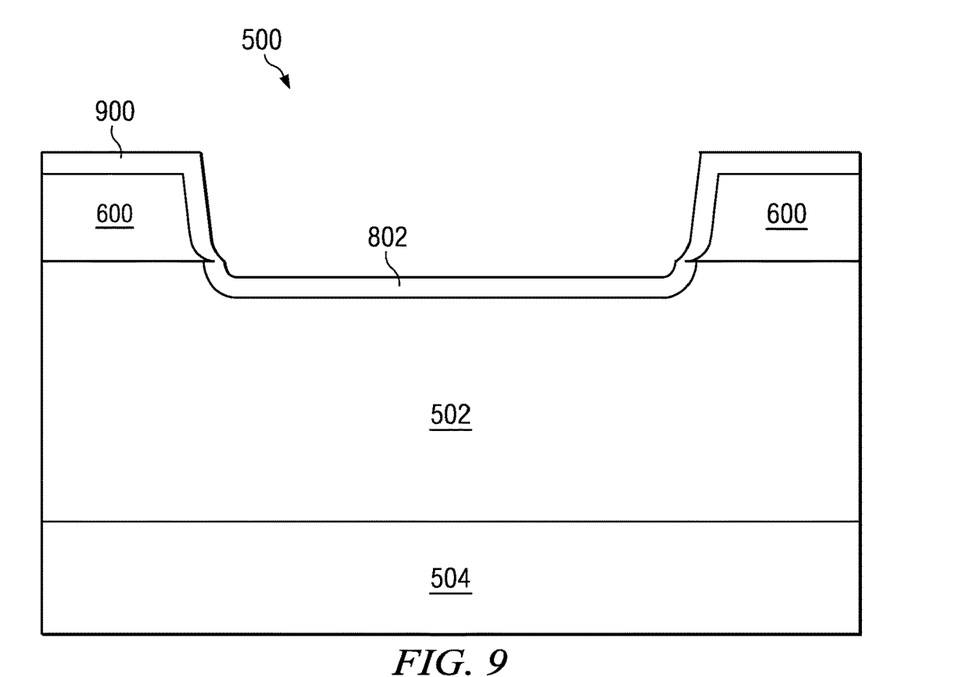

In FIG. 9, a silicidation metal 900 has been conformally deposited over the dielectric layer 600 and the recessed region 702. This silicidation metal 900 may be deposited, for example by a sputtering process, evaporation, CVD or any other suitable technique. In one embodiment, the silicidation metal could be Platinum (Pt), Palladium (Pd) or Cobalt (Co), although any other suitable metal could be used.

Figure 10:
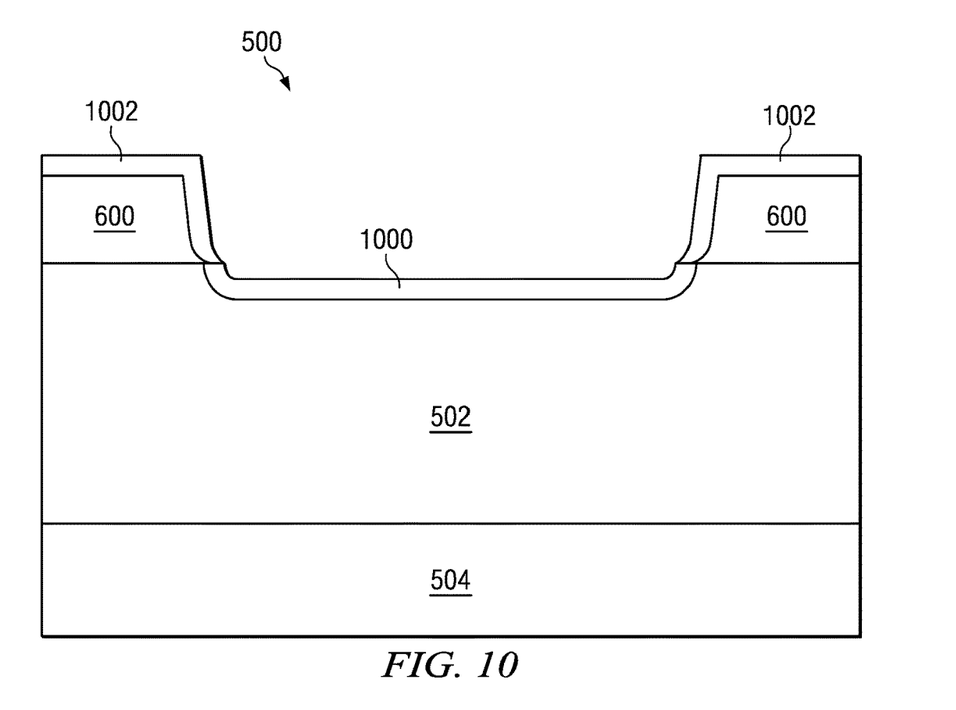

In FIG. 10, the structure is exposed to a high temperature treatment(s) to convert the silicidation metal that contacts the cathode to a silicide. As shown, FIG. 9's deposited silicidation metal 900 has now been converted to a silicide layer 1000 over the silicon cathode region with a non-silicided metal 1002 remaining over the regions not having silicon exposed. Typically, the silicide layer 1000 could be a high barrier height near-noble metal silicide, such as PtSi or $Pd_2Si$, for example. However, the disclosure may be applicable to any silicide. The high temperature treatment can be done in conventional furnace or in rapid thermal processors or flash and or spike anneal processors. The temperature treatment temperature and time are adjusted as required for different silicidation metals. The ambient used during heat treatment can be neutral, oxidazing or reducing, depending up selection of a particular silicidation metal.

Figure 11:
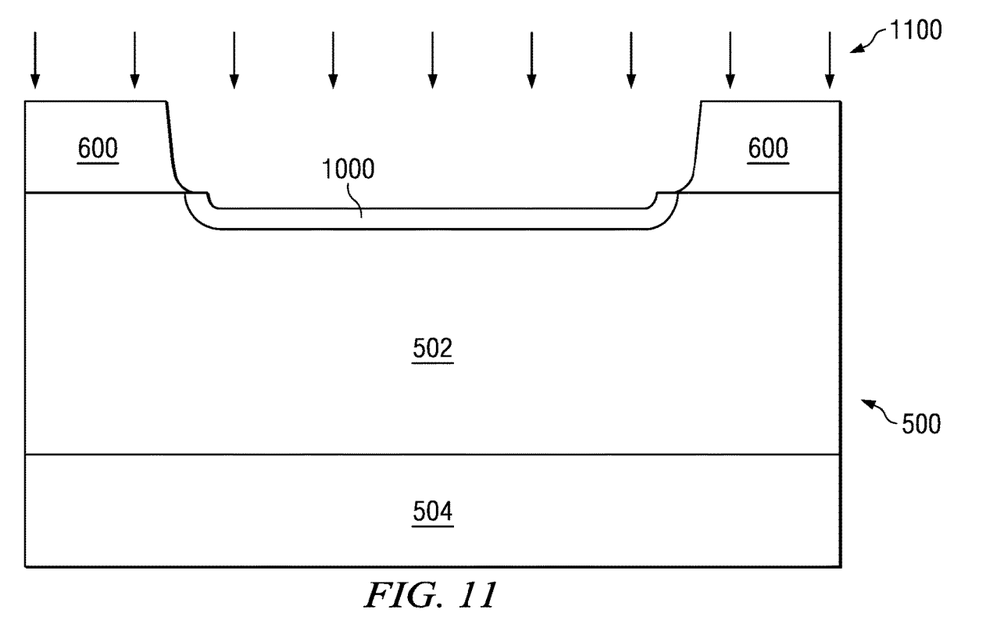

In FIG. 11, an etch 1100 is performed to remove the non-silicided metal 1002, where the etch chemistry depends on the chemical composition of the silicide layer.

Figure 12:
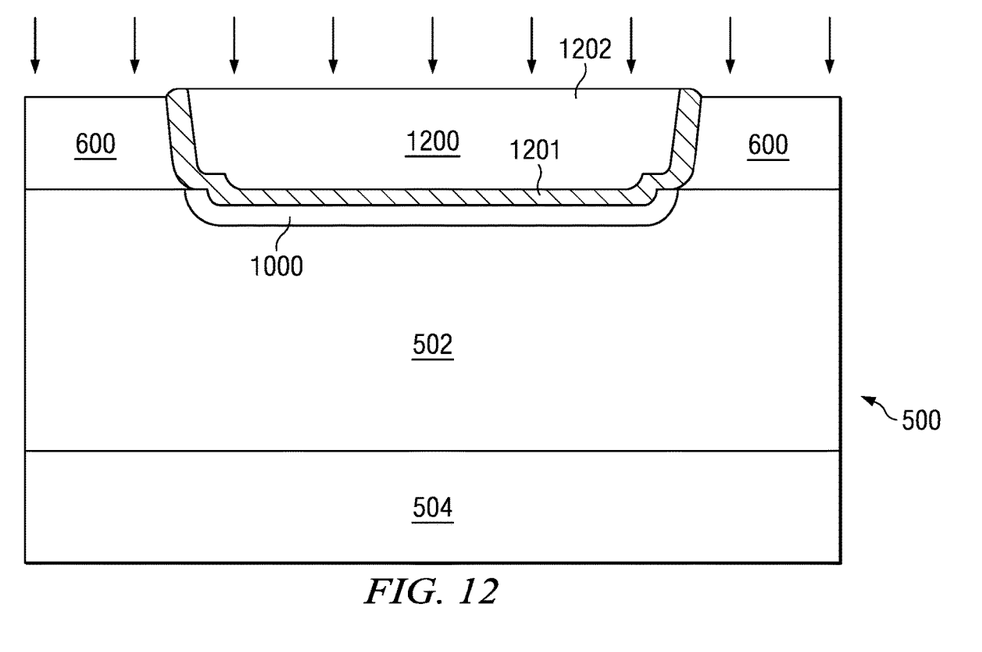

In FIG. 12, a metal 1200, typically comprised of a diffusion barrier metal and/or adhesion metal layer 1201 and some form of high conductivity filler metal 1202 such as aluminum (Al) or copper (Cu), for example, is deposited to form a contact for the anode. A Ti-based metal or TiN compound or their combination are examples of barrier metals used in the industry for this purpose.

Although the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method, comprising:
    forming a dielectric layer on a cathode layer of a semiconductor substrate;
    defining a window through the dielectric layer to expose the cathode layer;
    defining a recess into the cathode layer through the window, the recess having a perimeter extending under a sidewall of the dielectric layer circumscribing the window;
    forming an isolation layer within the recess, the isolation layer extending to the perimeter of the recess and contacting a bottom surface of the sidewall; and
    forming an anode layer on the sidewall and the isolation layer.

2. The method of claim 1, wherein:
    the cathode layer includes an n-doped silicon layer; and
    the isolation layer includes a silicide layer.

3. The method of claim 1, wherein forming the isolation layer includes:
    depositing a silicidation metal on the sidewall and covering the recess;
    siliciding the silicidation metal covering the recess; and
    removing the silicidation metal from the sidewall.

4. The method of claim 3, wherein the silicidation metal includes a metal selected from a group consisting of platinum, palladium, cobalt, and combinations thereof.

5. The method of claim 1, wherein forming the anode layer includes:
    depositing a diffusion barrier metal on the sidewall and the isolation layer to form a diffusion barrier metal trench; and
    filling the diffusion barrier metal trench with a filler metal.

6. The method of claim 5, wherein the diffusion barrier metal includes titanium-based metal, a titanium nitride material, or a combination thereof.

7. The method of claim 5, wherein the diffusion barrier metal trench is isolated from the cathode layer around the perimeter of the recess by the isolation layer.

8. The method of claim 1, wherein the isolation layer isolates the cathode layer from the anode layer around the perimeter of the recess.

9. The method of claim 1, wherein the sidewall includes:
    a vertical portion contacting the anode layer; and
    a concave tail portion interposing between the anode layer and the isolation layer.

10. The method of claim 1, wherein the perimeter of the recess extends under the sidewall by a distance ranges from 10 nm to 100 nm.

11. A method, comprising:
    forming a dielectric layer on an n-doped silicon layer of a semiconductor substrate;
    defining a window through the dielectric layer to expose the n-doped silicon layer;
    defining a recess into the n-doped silicon layer through the window, the recess having a perimeter extending under a sidewall of the dielectric layer circumscribing the window;
    forming a silicide layer within the recess, the silicide layer extending to the perimeter of the recess and contacting a bottom surface of the sidewall; and
    forming an electrode layer on the sidewall and the silicide layer.

12. The method of claim 11, wherein forming the silicide layer includes:
    depositing a silicidation metal on the sidewall and covering the recess;
    siliciding the silicidation metal covering the recess; and
    removing the silicidation metal from the sidewall.

13. The method of claim 12, wherein the silicidation metal includes a metal selected from a group consisting of platinum, palladium, cobalt, and combinations thereof.

14. The method of claim 11, wherein forming the electrode layer includes:
    depositing a diffusion barrier metal on the sidewall and the silicide layer to form a diffusion barrier metal trench; and
    filling the diffusion barrier metal trench with a filler metal.

15. The method of claim 14, wherein the diffusion barrier metal includes titanium-based metal, a titanium nitride material, or a combination thereof.

16. The method of claim 14, wherein the diffusion barrier metal trench is isolated from the n-doped silicon layer around the perimeter of the recess by the silicide layer.

17. The method of claim 11, wherein the sidewall includes:
    a vertical portion contacting the electrode layer; and
    a concave tail portion interposing between the electrode layer and the silicide layer.

18. A method, comprising:
    forming a dielectric layer on an n-doped silicon layer of a semiconductor substrate;
    defining a window through the dielectric layer to expose the n-doped silicon layer;
    defining a recess into the n-doped silicon layer through the window, the recess having a perimeter extending under a sidewall of the dielectric layer circumscribing the window;
    forming a silicide layer within the recess, the silicide layer extending to the perimeter of the recess and contacting a bottom surface of the sidewall; and
    forming an electrode layer on the sidewall and the silicide layer,
    wherein
        the sidewall includes a vertical portion contacting the electrode layer; and
        a concave tail portion interposing between the electrode layer and the silicide layer.

19. The method of claim 18, wherein forming the silicide layer includes:
    depositing a silicidation metal on the sidewall and covering the recess;
    siliciding the silicidation metal covering the recess; and
    removing the silicidation metal from the sidewall.

20. The method of claim 11, wherein forming the electrode layer includes:
    depositing a diffusion barrier metal on the sidewall and the silicide layer to form a diffusion barrier metal trench;
    filling the diffusion barrier metal trench with a filler metal; and the diffusion barrier metal trench is isolated from the n-doped silicon layer around the perimeter of the recess by the silicide layer.

\* \* \* \* \*